United States Patent
Reinmuth et al.

(10) Patent No.: US 8,695,427 B2
(45) Date of Patent: Apr. 15, 2014

(54) MICROMECHANICAL COMPONENT HAVING A TEST STRUCTURE FOR DETERMINING THE LAYER THICKNESS OF A SPACER LAYER AND METHOD FOR MANUFACTURING SUCH A TEST STRUCTURE

(75) Inventors: Jochen Reinmuth, Reutlingen (DE); Ralf Boessendoerfer, Dinkelsbuehl (DE); Axel Franke, Ditzingen (DE); Mirko Hattass, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 264 days.

(21) Appl. No.: 13/116,759

(22) Filed: May 26, 2011

(65) Prior Publication Data
US 2011/0296917 A1    Dec. 8, 2011

(30) Foreign Application Priority Data
Jun. 2, 2010   (DE) .................. 10 2010 029 645

(51) Int. Cl.
*G01P 15/125*   (2006.01)

(52) U.S. Cl.
USPC ...................................... 73/514.32

(58) Field of Classification Search
USPC ............ 73/514.32, 514.17, 514.18, 514.38, 73/504.12, 504.14
See application file for complete search history.

(56) References Cited

U.S. PATENT DOCUMENTS

| | | | | |
|---|---|---|---|---|
| 6,679,995 | B1* | 1/2004 | Banjac et al. | 216/2 |
| 6,990,864 | B2* | 1/2006 | Sakai | 73/514.32 |
| 7,024,933 | B2* | 4/2006 | Malametz | 73/514.32 |
| 7,140,250 | B2* | 11/2006 | Leonardson et al. | 73/504.14 |
| 7,270,003 | B2* | 9/2007 | Sassolini et al. | 73/514.32 |
| 7,293,460 | B2* | 11/2007 | Zarabadi et al. | 73/514.32 |
| 7,418,864 | B2* | 9/2008 | Asami et al. | 73/514.32 |
| 7,600,428 | B2* | 10/2009 | Robert et al. | 73/514.32 |
| 8,381,570 | B2* | 2/2013 | Ohms et al. | 73/1.38 |
| 8,461,833 | B2* | 6/2013 | Classen et al. | 324/244 |

* cited by examiner

*Primary Examiner* — Helen Kwok
(74) *Attorney, Agent, or Firm* — Kenyon & Kenyon LLP

(57) ABSTRACT

A micromechanical component is described including a substrate having a spacer layer and a test structure for ascertaining the thickness of the spacer layer. The test structure includes a seismic mass, which is elastically deflectable along a measuring axis parallel to the substrate, a first electrode system and a second electrode system for deflecting the seismic mass along the measuring axis, having a mass electrode, which is produced by a part of the seismic mass, and a substrate electrode, which is situated on the substrate in each case, the first electrode system being designed to be thicker than the second electrode system by the layer thickness of the spacer layer.

8 Claims, 7 Drawing Sheets

MICROMECHANICAL COMPONENT HAVING A TEST STRUCTURE FOR DETERMINING THE LAYER THICKNESS OF A SPACER LAYER AND METHOD FOR MANUFACTURING SUCH A TEST STRUCTURE

CROSS REFERENCE

The present application claims the benefit under 35 U.S.C. §119 of German Patent No. DE 102010029645.7 filed on Jun. 2, 2010, which is expressly incorporated herein by reference in entirety.

FIELD OF THE INVENTION

The present invention relates to a micromechanical component having a test structure for determining the layer thickness of a spacer layer in a micromechanically manufactured motion sensor. Furthermore, the present invention also relates to a method for manufacturing such a test structure.

BACKGROUND INFORMATION

Micromechanical sensors are used in various technical applications, for example, as motion sensors for detecting the instantaneous acceleration or yaw rate. These motion sensors are frequently based on microelectromechanical systems (MEMS) which may be read out capacitively, in which the motion of a seismic mass is converted with the aid of a suitable electrode system into a measurable capacitance change. Corresponding electrodes may also be used for the capacitive excitation of the motion of the seismic mass.

The sensitivity of microelectromechanical sensors is a function of various parameters, which may be controlled to varying extents in the manufacturing method. Scattering in the manufacturing process thus frequently results in deviations in the desired geometry of a sensor structure, whereby the response behavior of the sensor may be negatively influenced. For example, the process-related variation in the edge loss or thickness variations of the produced layers come into consideration as error sources. The latter determine the height and the spacing of the produced structures. Thus, for example, the measuring sensitivity of a capacitive sensor is decisively a function of the spacing of the sensor electrodes, which, in the case of a z-acceleration sensor designed as a rocker (out-of-plane sensor element), is typically set with the aid of a spacer layer, which is produced as a sacrificial layer and removed again after the sensor body is finished. Since the spacer layer thickness may only be established with inadequate precision in the manufacturing process, the spacing of the two measuring electrodes of the sensor varies, and therefore also its measuring sensitivity from sensor to sensor. Because of these sensitivity variations, complex mechanical compensation methods must be performed in the respective sensors, the typical accelerations having to be applied to each sensor and the internal amplification pathways having to be adapted on the basis of the particular sensor response.

Alternatively, all process controls, such as the thickness of the individual layers or the edge loss (the difference between the width of a structure provided in the layout and the structure width actually achieved after the processing), must be known as much as possible, so that their effects on the functional parameters may be compensated for by computer.

The prior test methods do not allow certain processing parameters for the sensitivity compensation of a z-acceleration sensor, in particular the sacrificial layer thickness, to be determined with sufficient precision.

It is therefore an object of the present invention to provide a test structure which may be integrated into the sensor core, and which allows a precise determination of the thickness of a spacer layer.

SUMMARY

According to an example embodiment of the present invention, a micromechanical component including a substrate having a spacer layer and a test structure for ascertaining the thickness of the spacer layer is provided. The test structure includes a seismic mass, which is elastically deflectable along a measuring axis parallel to the substrate, a first electrode system and a second electrode system for deflecting the seismic mass along the measuring axis, having a mass electrode, which is formed by a part of the seismic mass, and a substrate electrode, which is situated on the substrate, in each case. The first electrode system is designed to be thicker than the second electrode system by generally the layer thickness of the spacer layer. Due to the different electrode thicknesses, a different effective electrode surface area results and, in combination therewith, a different electrostatic action of the respective electrode systems. Therefore, the seismic mass is deflected more strongly by the first electrode system than by the second electrode system upon application of an activation voltage to the electrodes of the two electrode systems. Since the resulting deflection of the seismic mass is directly related to the thickness difference of the participating electrodes, the thickness of the spacer layer may be ascertained therefrom. This allows a simple determination of those properties of the micromechanical component or the components thereof which are a function of the thickness of the spacer layer. For example, with the aid of the test structure, a calibration of a sensor structure, which was produced with the aid of the spacer layer, may be implemented. In this way, complex mechanical testing methods of the sensor structure may be dispensed with, which is reflected in lower manufacturing costs.

In an additional specific embodiment it is provided that the two mass electrodes and their associated substrate electrodes are each designed as two interlocking comb structures. Such comb structures allow a large effective electrode surface area, which results in better sensitivity of the particular electrode system. The comb electrodes generate a greater electrostatic force and therefore cause a greater deflection of the seismic mass. The measurability and therefore the precision of the testing method is in turn increased by the greater deflection.

An additional specific embodiment of the present invention provides that the test structure is designed as a lateral acceleration sensor having at least one detection electrode system for detecting the lateral deflection of the seismic mass. It is advantageous to use an acceleration sensor which is provided on the substrate in any case as the test structure, since in this way additional micromechanical structures may be saved.

According to an additional advantageous specific embodiment, a sensor structure having a mass, which is movable generally perpendicularly to the substrate, is situated on the substrate. The mass includes at least one electrode, which cooperates with a counter electrode situated at a distance therefrom determined generally by the thickness of the spacer layer.

In an additional specific embodiment, the sensor structure is designed as a z-acceleration or yaw rate sensor in the form of a rocker or trampoline. Since, in these sensors, the spacing of the seismic mass and the substrate underneath it are set via a spacer layer, which is used as a sacrificial layer, the test structure is ideally suitable for adapting such a sensor.

Furthermore, an example method for determining the thickness of a spacer layer on a substrate with the aid of a corresponding test structure is provided according to the present invention, in a first step, a first activation voltage being applied to the first electrode system to deflect the seismic mass in a first direction and a second activation voltage being applied to the second electrode system to deflect the seismic mass in a second direction, which is opposite to the first direction. The resulting deflection of the seismic mass is subsequently measured. Finally, the layer thickness of the spacer layer is calculated on the basis of the resulting deflection of the seismic mass. The test method does not require an external intervention. Rather, the measurement of the layer thickness is solely performed by activating the electrodes and by analyzing the response of the test structure. The test method is therefore optimally suitable for calibrating sensor structures which are designed jointly with the test structure on the substrate. The possibility of activating the two electrode systems using different activation voltages allows the resulting deflection of the seismic mass to be limited, for example, if an unfavorable thickness ratio of the two electrode systems would result in an excessively strong deflection. Furthermore, the different electrostatic actions of two electrode systems may thus also be compensated for. Therefore, test structures having two asymmetrical electrode systems may also be used.

In an additional specific embodiment, the second activation voltage is selected as a function of the first activation voltage in such a way that the seismic mass still remains in the same position upon application of both voltages as without application of the activation voltages. The desired layer thickness is ascertained on the basis of the ratio of the two activation voltages. Since the seismic mass is held in its rest or zero position with the aid of suitable activation voltages in this alternative measuring method, influencing variables which accompany the deflection of the mass, such as spring strength or nonlinear behavior of the capacitances in the event of stronger deflection, do not play a role in the determination of the layer thickness. In this way, on the one hand, the method may be simplified. Furthermore, higher precision of the method may also be achieved by omitting possible error sources.

In an additional specific example embodiment it is provided that the first substrate electrode and the second substrate electrode are connected to a shared electrical potential to deflect the seismic mass. In this way, both the activation of the test structure and also the analysis of the resulting deflection are simplified.

Furthermore, an example method for manufacturing a micromechanical component is provided according to the present invention, in which a substrate having an insulation layer situated thereon is initially provided. In a first electrode area and a second electrode area of the insulation layer, which is preferably formed as an oxide layer, a layer stack including an electrically conductive layer and a spacer layer situated thereon is produced in each case. The spacer layer is subsequently removed in the first electrode area. A functional layer is then deposited and preferably planarized, a trench structure produced by the removal of the spacer layer in the first electrode area being filled up during the deposition. Subsequently, the functional layer and the electrically conductive layer exposed in the first electrode area are structured in order to produce a plate-shaped structure, a mass electrode formed by a part of the plate-shaped structure and a substrate electrode opposite thereto being produced in each of the two electrode areas. Finally, the spacer layer and the oxide layer are removed in the area of the plate-shaped structure, in order to produce a seismic mass which is deflectable in relation to the substrate. Electrode heights in the two electrode areas which differ generally by the thickness of the spacer layer are therefore achieved in a simple way.

In a modification of the example manufacturing method, during the structuring of the functional layer and the electrically conductive layer exposed in the first electrode area, the two layers are removed in a joint method step. This allows a simplification of the manufacturing method.

In an additional modification of the example method, the oxide layer and the spacer layer are removed with the aid of an isotropic etching method. This allows undercutting of the plate-shaped structure.

An additional modification of the example method provides that an oxide layer is used as the spacer layer. In this way, it is possible to remove the spacer layer and the lower oxide layer in a joint etching method.

An additional modification of the example method provides that the spacer layer is removed with the aid of an etching method, an etch stop layer being used below the spacer layer, which prevents etching of the electrically conductive layer. Since the electrically conductive layer is not also etched during removal of the spacer layer, its layer thickness does not change. Since the thickness of this layer is generally known, a higher precision may therefore be achieved during measurement of the layer thickness of a spacer layer.

Finally, an additional modification of the example method provides that the electrically conductive layer is used as the etch stop layer. The manufacturing method is thus simplified, since no additional etch stop layer must be produced.

BRIEF DESCRIPTION OF THE DRAWINGS

The present invention is described in greater detail below based on the figures.

DETAILED DESCRIPTION OF EXAMPLE EMBODIMENTS

Figure 1:
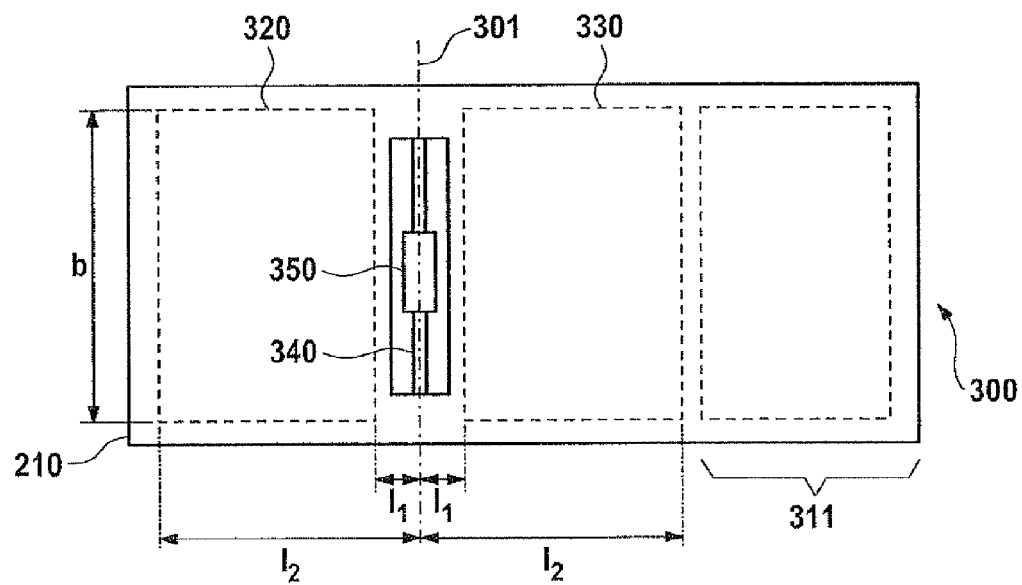
FIG. 1 shows a top view of a sensor structure which is designed as a z-acceleration sensor in the form of a rocker according to the related art.
Figure 2:
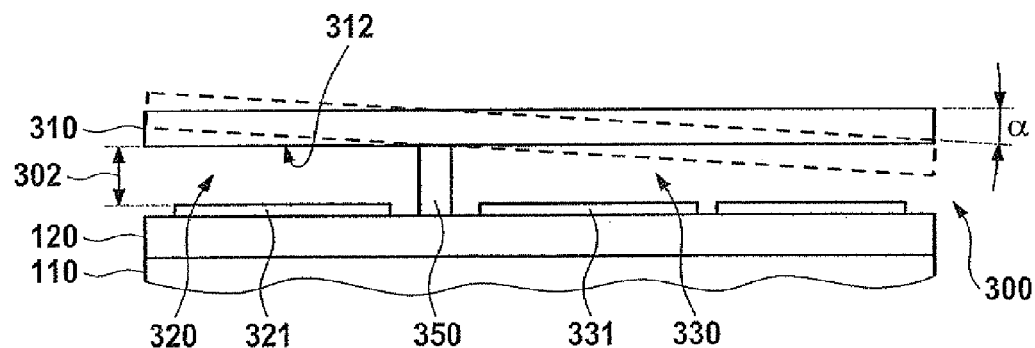
FIG. 2 shows a schematic side view of the z-acceleration sensor in the form of a rocker from FIG. 1.

FIGS. 1 and 2 show a typical z-acceleration sensor (zES), which is designed in the so-called "rocker design." Micromechanical sensor 300, which is shown in a top view in FIG. 1, generally includes a plate-shaped body 310, which, with the aid of a spring structure 340, is suspended rocker-like and deflectable in relation to a substrate 110 situated underneath. Plate 310, which is used as the seismic mass, may be connected via two torsion springs 340, for example, to a central carrier structure 350, the suspension of seismic mass 310 being selected in such a way that an auxiliary mass 311 results on one side, which causes a torque perpendicular to the substrate plane and therefore a deflection a of the rocker from its rest/zero position in the event of an acceleration of the sensor structure. The motion of rocker 310 is capacitively analyzed with the aid of two detection electrodes 321, 331, which are situated on both sides of carrier structure 350, and which each form a separate detection electrode system 320, 330 with seismic mass 310 or an electrode formed by the bottom side of seismic mass 310 as shared counter electrode 312. As is indicated in FIG. 2 using the dashed line, a deflection of seismic mass 310 by an angle α to the left causes an increase of distance 301 between left detection electrode 321 and mass electrode 312, while distance 301 between right detection electrode 331 and mass electrode 312 is simultaneously decreased. In this way, a capacitance difference is achieved between left and right detection electrode systems 320, 330. Capacitance $C_1$, $C_2$ of detection electrode systems 310, 320 may be determined for small deflections α by:

$$C_{1,2} = \varepsilon_0 \frac{lb}{d_{ox} \pm \alpha \frac{(l_1 + l_2)}{2}}$$

Where
$d_{ox}$: base distance between detection electrode and seismic mass;
$\varepsilon_0$: dielectric constant in the vacuum;
$l_1$: distance of the electrode edge close to the rotational axis from the rotational axis;
$l_2$: distance of the electrode edge far from the rotational axis from the rotational axis, and
lb: effective electrode surface area as a product of length l and width b of the electrode.

Base distance 301 between detection electrodes 321, 331 and seismic mass 310, which is used as shared electrode 312, corresponds to layer thickness $d_{ox}$ of a spacer layer 140, which is used in the manufacturing process as a sacrificial layer below the seismic mass and is removed in the further course of the process. As a result, the detection sensitivity of sensor structure 300 is directly a function of layer thickness $d_{ox}$ of this spacer layer.

Fundamentally, it is possible through an electrical test signal on both detection electrodes 321, 331 to achieve a deflection of rocker 310, which is also a function of electrode distance 302 or layer thickness $d_{ox}$. However, it has been shown that the precision of this method is inadequate to be used for the sensor calibration. In particular, test signal and sensitivity behave significantly differently in the event of a change of basic distance $d_{ox}$, which makes it more difficult to ascertain the sensitivity from the test signal response.

In order to be able to determine the sensitivity of the sensor with sufficient precision, a test structure according to the present invention is therefore used. For example, a modified lateral acceleration sensor may be used as the test structure, which is typically produced on a substrate jointly with the z-acceleration sensor to be tested.

Figure 3:
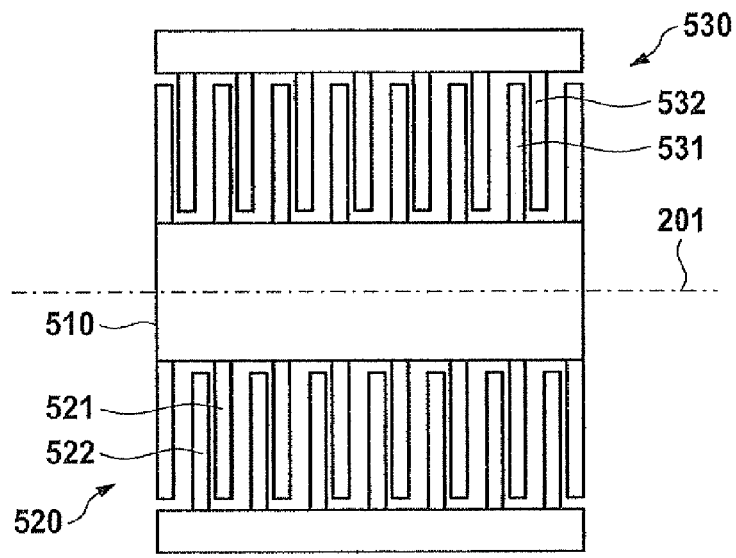
FIG. 3 shows a conventional lateral acceleration sensor.

Such a lateral acceleration sensor is generally designed in the form of a body which is elastically deflectable in relation to the substrate, the detection direction typically being determined by the deflection direction. To illustrate the functional principle, FIG. 3 shows such a simply configured x-acceleration sensor. It generally includes a plate-shaped seismic mass 510, on each of whose longitudinal sides an electrode system 520, 530 is provided for the capacitive detection of the instantaneous deflection of seismic mass 510. Electrode systems 520, 530 each include a mass-side comb electrode 521, 531 formed from multiple comb tines, which cooperates with a corresponding substrate-side counter electrode 531, 532 designed as a comb. Every deflection of the seismic mass along measuring axis 201 changes the spacing between mass-side and substrate-side electrodes 521, 522, 531, 532 of an electrode system 520, 530, and therefore also their capacitances. For differential measurement of the capacitance change, electrodes 521, 522, 531, 532 of both electrode systems 520, 530 are each situated offset to one another in such a way that a deflection of seismic mass 510 from its central position results in the increase of the capacitance in one of the two electrode systems 520, 530, while the capacitance of the opposite electrode system is reduced.

Figure 4:
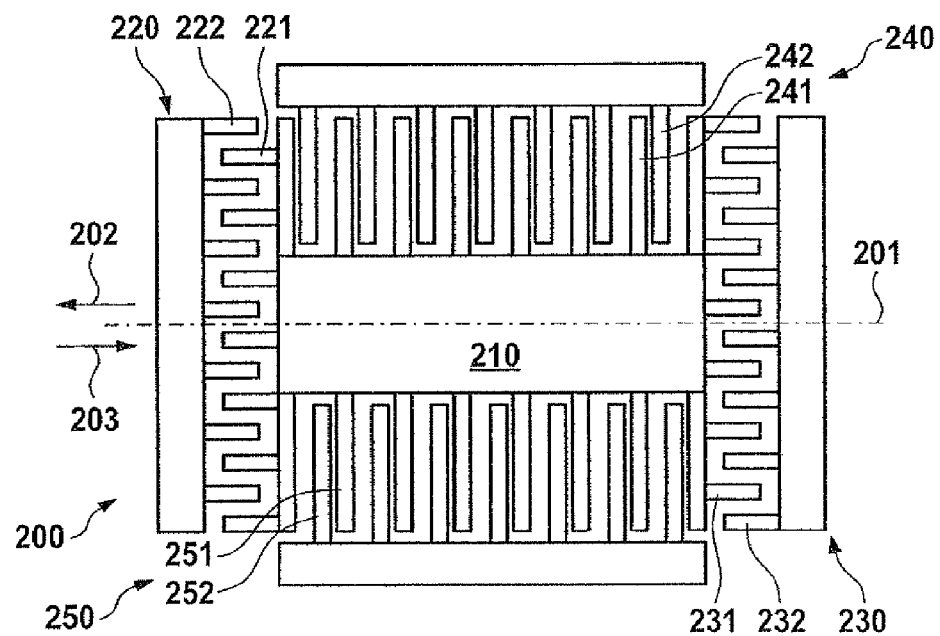
FIG. 4 shows a lateral acceleration sensor modified according to an example embodiment of the present invention having a first additional electrode system and a second additional electrode system.

FIG. 4 shows a lateral acceleration sensor 200 having an electrode system which is expanded in relation to sensor structure 500 from FIG. 3. In addition to both electrode systems 240, 250 running along measuring axis 201, acceleration sensor 200 additionally has two frontally situated electrode systems 220, 230. Both additional electrode systems 220, 230 are also configured as combs, each having a mass electrode 221, 231 including multiple comb tines and a substrate electrode 222, 232 including a corresponding number of comb tines. The comb tines of both mass electrodes 221, 231, which are distributed essentially equidistantly above the particular front side of seismic mass 210, and the particular outermost comb tines of both lateral electrodes 240, 250, are each oriented in one of deflection directions 202, 203 and engage in the comb tines of particular substrate electrodes 222, 232, which are also oriented in one of deflection directions 202, 203. In contrast to electrode systems 240, 250 situated on the longitudinal sides, in which a deflection of seismic mass 210 along measuring axis 201 directly causes a change in the electrode spacing, in both frontally situated electrode systems 220, 230, the deflection of seismic mass 210 results in a change of the engagement depth of particular interlocking electrodes 221, 222, 231, 232, which is also reflected in the form of a measurable capacitance change. Spring structures, which may be implemented as bending or torsion springs, for example, are typically used for the elastic suspension of seismic mass 210 in relation to substrate 110. Such spring structures are not shown in the figures for reasons of simplified illustration.

In order to be able to use lateral acceleration sensor 200 as a test structure for measuring thickness $d_{ox}$ of spacer layer 140, both frontal electrode systems 220, 230 are designed to have different thicknesses. Structural thickness $d_{EP1}$ of first electrode system 220 is designed to be thicker generally by spacer layer thickness $d_{ox}$, which is to be determined, than structural thickness $d_{EP2}$ of second electrode system 230. Since the effective electrode surface area of an electrode system is directly determined by the thickness or height of the associated electrodes, the capacitance difference of both electrode systems 220, 230 is also a function of layer thickness $d_{ox}$ of spacer layer 140. Due to the different capacitances, a different electrostatic effect of both electrode systems 220, 230 on seismic mass 210 also results. Seismic mass 210 of both electrode systems 220, 230 is therefore deflected to different extents upon application of the same activation voltage. The resulting deflection is also a function of layer thickness $d_{ox}$ of spacer layer 140. More precisely, the thickness difference of both electrode systems 220, 230 in the specific embodiments of the present invention shown here corresponds to the sum of layer thickness $d_{ox}$ of spacer layer 140 and layer thickness $d_{VP}$ of wiring layer 130, wiring layer 130 preferably being designed to be very thin in comparison to spacer layer 140, so that the influence of process-related thickness variations of wiring layer thickness $d_{VP}$ on electrode thicknesses 223, 233 and therefore on the measured deflection of seismic mass 210 is negligible in the ideal case.

In the case of a lateral acceleration sensor, the deflection may be directly measured via analysis channel xBS, which is provided in any case. It is directly proportional to the sum of layer thickness $d_{ox}$ of spacer layer 140 and layer thickness $d_{VP}$ of wiring layer 130. The forces arising on both electrode systems 220, 230 may be described as follows:

$$F_{1,2} = \frac{1}{2}\frac{dC}{dx}NU^2 = \frac{1}{2}U^2N\frac{d}{dx}\left(\frac{\varepsilon_0 h_{1,2}(l+x)}{d_{gap}}\right) = \frac{1}{2}U^2N\frac{\varepsilon_0 h_{1,2}}{d_{gap}}$$

Where
U: potential difference between the substrate electrodes and the seismic mass;
N: number of the comb electrodes;
$h_{1,2}$: electrode thickness in the electrode area;
$d_{gap}$: distance between the comb electrodes (identical to distance between the plate electrodes in the lateral channel);
$\varepsilon_0$: dielectric constant in the vacuum, and
x: deflection of the seismic mass.

The effective net force on the seismic mass therefore results as:

$$\Delta F = F_1 - F_2 = \frac{1}{2}U^2N\frac{\varepsilon_0(d_{ox} + d_{VP})}{d_{gap}}$$

If spring stiffness k of the suspension of seismic mass 210 is known, net force $\Delta F$ may be calculated from equation $x = \Delta F/k$, and therefore also the sum of layer thicknesses $d_{ox} + d_{VP}$ of spacer layer 140 and wiring layer 130. The precision with which layer thickness $d_{ox}$ of spacer layer 140 may finally be determined is a function of how precisely layer thickness $d_{VP}$ of wiring layer 130 may be set in the manufacturing process. Since process-related thickness variations of wiring layer 130 have a direct effect on the determination of the spacer layer thickness, they also emerge as errors in the case of the sensitivity determination of the sensor structure performed on the basis of the ascertained spacer layer thickness. For electrode distance $d_{gap}$, the deviation between the width of the structure provided in the layout and the actually achieved structure width after processing, which is referred to as the edge loss, is decisive. Therefore, to increase the precision of the method, it may be expedient to ascertain the edge loss in another way and to use electrode distance $d_{gap}$ thus corrected to determine spacer layer thickness $d_{ox}$.

Alternatively, activation voltages $U_1$ and $U_2$ may be adapted to one another in such a way that the resulting equilibrium deflection corresponds to the rest or zero position of seismic mass 210. This is performed, for example, by applying a predefined first activation voltage $U_1$ to first electrode system 220 and varying second activation voltage $U_2$ until the deflection induced by first activation voltage $U_1$ is again generally compensated for by the effect of second electrode system 230.

Figure 5:
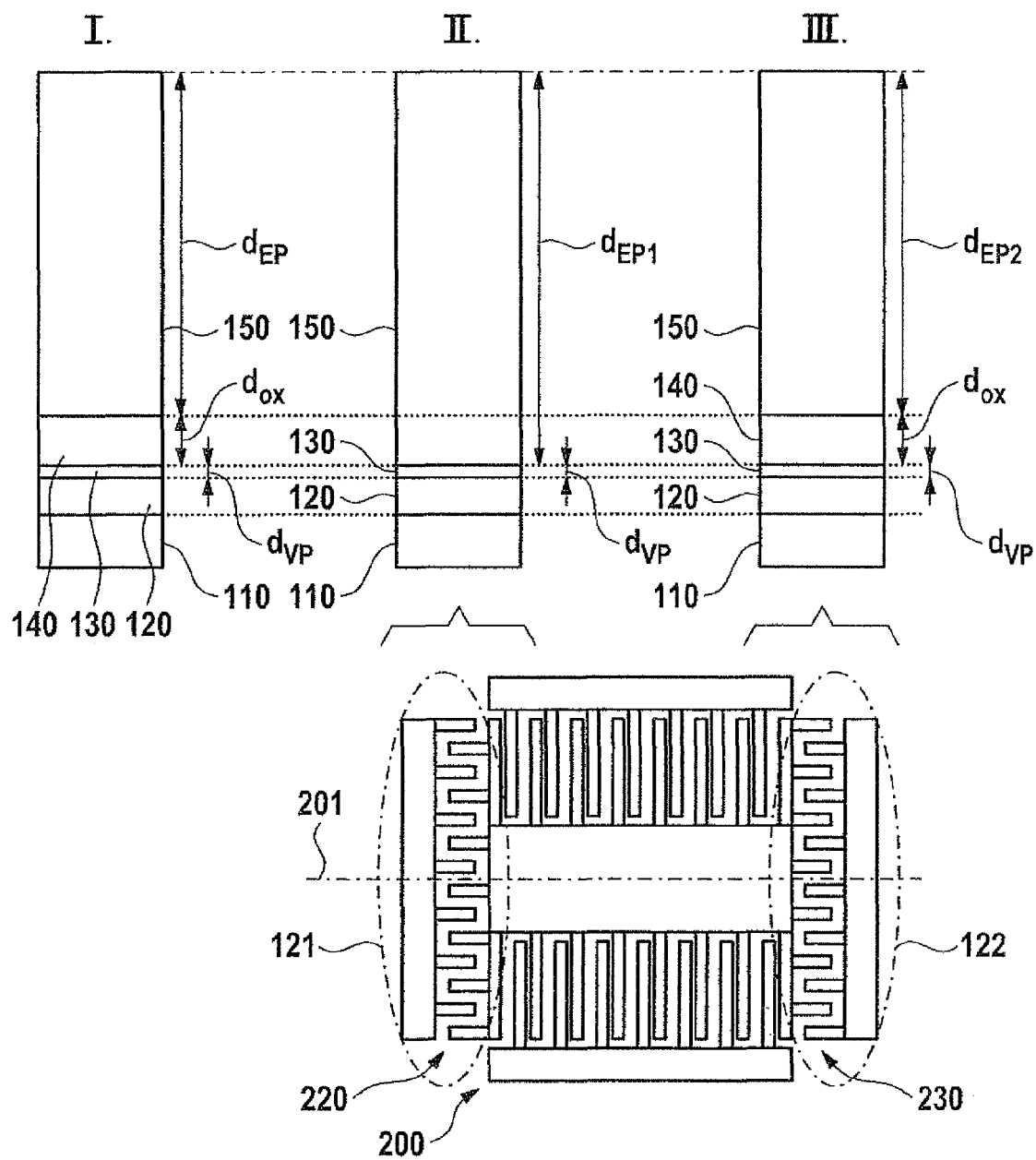
FIG. 5 shows a schematic view of the sequence and composition of the layers used to manufacture the test structure according to an example embodiment of the present invention.

To illustrate different structure thicknesses $d_{EP1}$, $d_{EP2}$ of both electrode systems 220, 230 of test structure 200 according to the present invention, FIG. 5 shows sectional views through the two electrode areas during the production of test structure 200. The difference in the sequence and composition of the layers of first electrode area 121 and second electrode area 122 of the modified lateral acceleration sensor according to the present invention are illustrated in comparison to an electrode area in the case of a conventionally manufactured lateral acceleration sensor. For this purpose, in the upper section of FIG. 5, the sectional views through the layer stacks of the particular electrode areas are each shown in the same phase of the manufacturing process. Sectional view I shows the layer sequence of a conventional acceleration sensor, a bottom insulation layer 120, preferably made of an oxide, an electrically conductive layer 130 having thickness $d_{VP}$, a spacer layer 140 having thickness $d_{ox}$, and a functional layer 150 having thickness $d_{EP}$ having been produced successively on a substrate 110. Second sectional view II shows the layer ratio in first electrode area 121 of test structure 200 processed according to the present invention, an insulation layer 120 also having been initially produced here on a substrate 110, on which an electrically conductive layer 130 was deposited in a predefined thickness $d_{VP}$. In contrast to the conventional process, spacer layer 140 was completely removed here, so that layer thickness $d_{EP1}$ of subsequently deposited functional layer 150 is greater precisely by thickness $d_{ox}$ of spacer layer 140 than layer thickness $d_{EP}$ of functional layer 150 in the conventional manufacturing process. Finally, third sectional view III shows the layer composition in second electrode area 122 of test structure 20 manufactured according to the present invention, which essentially corresponds to the layer composition of the conventionally manufactured electrode area shown in sectional view I. It becomes clear from a comparison of sectional views II and III that the electrode height of first electrode system 220, which is defined by layer thicknesses $d_{EP1}$ and $d_{VP}$ in first electrode area 121, differs by thicknesses $d_{ox}$ of spacer layer 140 and electrically conductive layer 130 from the electrode height of second electrode system 230, which is defined by layer thickness $d_{EP2}$ in second electrode area 131.

Figure 6:
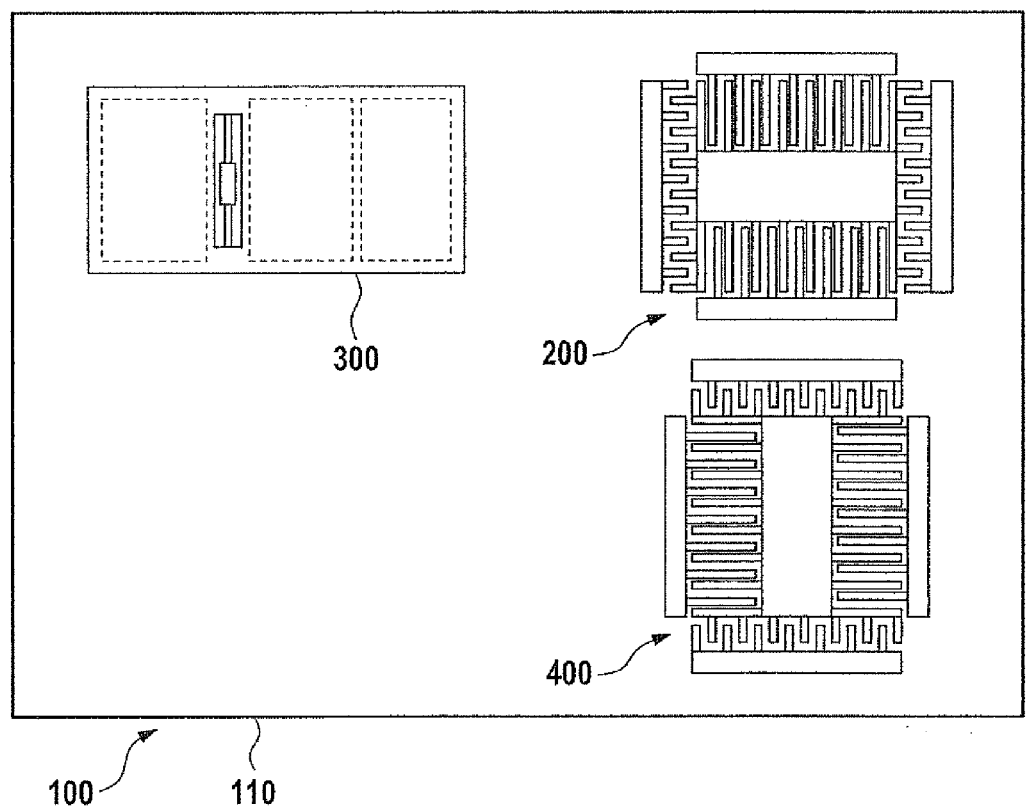
FIG. 6 shows a micromechanical component having a substrate including a sensor structure and a test structure according to an example embodiment of the present invention.

FIG. 6 shows a micromechanical component 100 designed according to the present invention, having a substrate 110 and multiple micromechanical structures 200, 300, 400 formed on substrate 110. In particular, a sensor structure 300 is situated on the substrate, which was manufactured with the aid of a spacer layer (not shown here). In the present case, this is rocker-shaped acceleration sensor 300 shown in FIG. 1. Furthermore, a test structure 200 according to the present invention is situated on substrate 110 to determine the properties of sensor 300. Test structure 200 is preferably designed as a lateral acceleration sensor. In addition to the function as a test structure, acceleration sensor 200 may also detect accelerations of micromechanical component 100 in the predefined detection direction. Furthermore, additional structures may also be formed on substrate 110. An additional lateral motion sensor 400 having a detection direction perpendicular to the detection direction of test structure 200 is provided in the present example.

Figure 7:
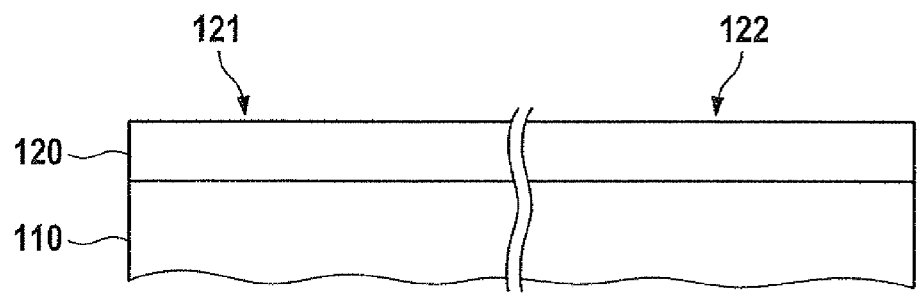
FIGS. 7 through 12 show a method for manufacturing the test structure according to the example embodiment of the present invention from FIGS. 4, 5, and 6.

A method for manufacturing test structure 200 from FIGS. 4 and 5 is shown as an example in following FIGS. 7 through 12. As the starting situation, FIG. 7 shows a substrate 110, on which an insulation layer 120, preferably designed to be an oxide layer, was already produced in preceding steps. A layer stack 123, 124, including an electrically conductive layer 130 used as a wiring layer and a spacer layer 140 situated thereon, is initially produced in each of two electrode areas 121, 122 of insulation layer 120. This may be performed, for example, by depositing a corresponding material in both electrode areas 121, 122. Both layer stacks 123, 124, as shown here, may be produced in depressions which were previously formed in insulation layer 120 with the aid of known methods.

On the other hand, it is also possible to deposit layer stack 123, 124 on insulation layer 120 without corresponding depressions.

Figure 8:
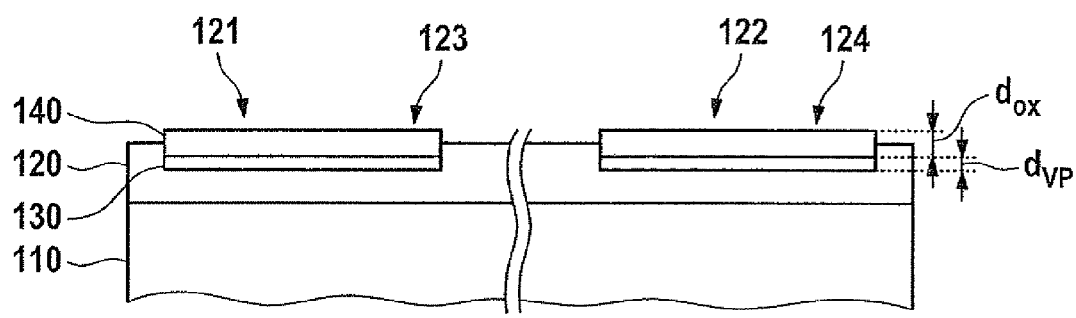

As shown in FIG. 8, electrically conductive layer 130 is preferably produced having a layer thickness $d_{VP}$, which is significantly less than layer thickness $d_{ox}$ of spacer layer 140 situated above it. Since the layer thickness difference of the two electrode systems of the test structure is composed of layer thickness $d_{ox}$ of spacer layer 140 and layer thickness $d_{VP}$ of electrically conductive layer 130, by using a relatively thin electrically conductive layer 130, the influence of the process-related thickness variations of this layer 130 may have the least possible effect when determining spacer layer thickness $d_{ox}$, and spacer layer thickness $d_{ox}$ may therefore be determined with the greatest possible precision.

In a method step subsequent thereto, spacer layer 140 is removed in first electrode area 121. This is preferably performed with the aid of an anisotropic etching method, which allows a removal of spacer layer 140 selectively to electrically conductive layer 130. Electrically conductive layer 130 may be directly used as the etch stop layer. However, it may be advantageous to use a separate etch stop layer. For this purpose, for example, a thin polysilicon layer may be deposited between electrically conductive layer 130 and spacer layer 140, which is only used as the etch stop layer. Furthermore, stop layers may be used, which are only slightly etched during the etching of spacer layer 140 and are only completely removed in an etching step performed later to remove lower oxide 120. Nitrite layers are suitable for this purpose, for example, since they are only slightly etched in the liquid HF.

Figure 9:
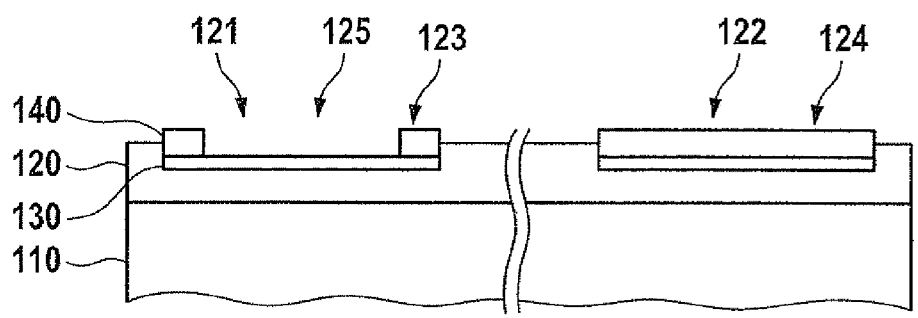

FIG. 9 shows the processed area of micromechanical element 100 after the etching of spacer layer 140. A trench structure 125 was produced by the complete removal of spacer layer 140 in a defined area within first electrode area 121.

Figure 10:
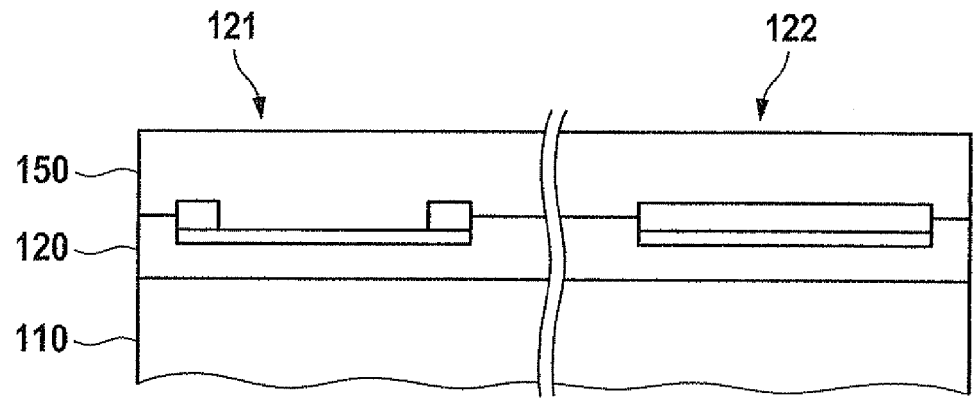

As shown in FIG. 10, a functional layer 150 having a defined thickness is subsequently produced on the surface thus formed. This is preferably performed by depositing an electrically conductive material up to a predefined height above spacer layer 140, trench structure 125 also being completely filled up using the deposited material. After the depositing of functional layer 150, a planarization step is preferably performed, in which functional layer 150 is removed uniformly to a defined depth using a suitable method.

Figure 11:
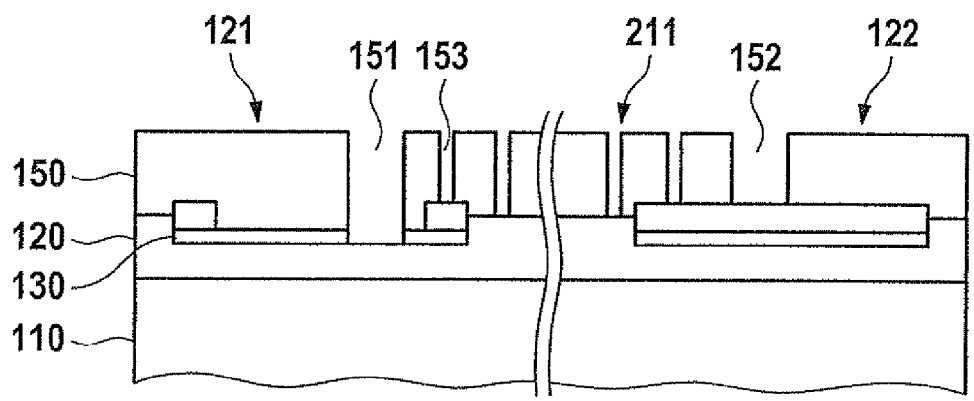

In the following method step, functional layer 150 is structured in order to produce a plate-shaped structure of later seismic mass 210. This may be performed with the aid of a lithographic method, for example. In this step, functional layer 150 is completely removed in the areas to be structured, electrically conductive layer 130 below functional layer 150 also preferably being removed in first electrode area 121. In contrast, the etching is only performed up to spacer layer 140 in second electrode area 122. Alternatively, the removal of the area of electrically conductive layer 130 in first electrode area 121 which is exposed by the structuring of functional layer 150 may also be performed in a separate etching process. Opposing electrodes are produced in both electrode areas 121, 122 by the structuring of functional layer 150, namely a mass electrode 221, 231, which forms a part of seismic mass 210, and a substrate electrode 222, 232, which is connected to substrate 110, in each case. Particular electrodes 221, 222, 231, 232, which form an electrode system 220, 230, are preferably designed as interlocking comb electrodes. During the structuring step, openings 153 of the plate-shaped body of seismic mass 210 are typically also produced, which make it easier to completely undercut seismic mass 210 to remove the sacrificial layers lying underneath. Furthermore, in this method stage, at least one spring structure (not shown here) is produced, which is used as an elastic suspension of seismic mass 210 in relation to substrate 110. Fundamentally, all suitable spring structures come into consideration as the spring structures, for example, bending or torsion springs. FIG. 11 shows test structure 200 after the structuring of functional layer 150 and wiring layer 130.

Figure 12:
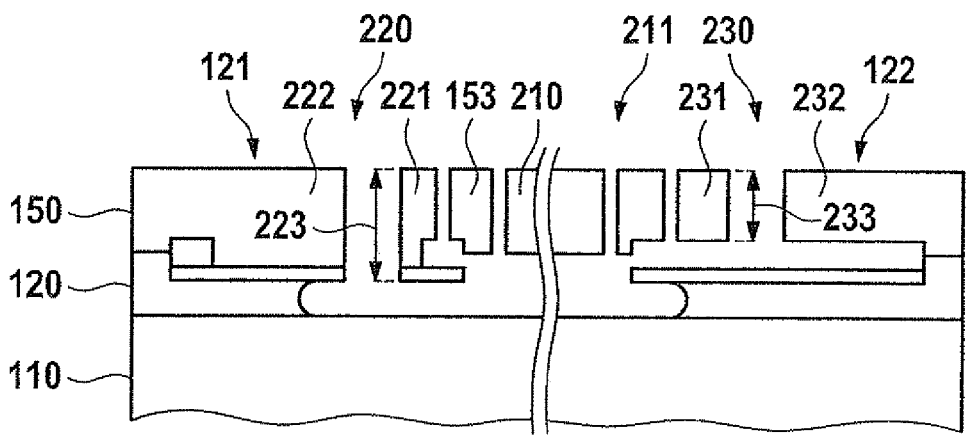

Finally, in an additional method step, remaining spacer layer 140 and oxide layer 120 lying underneath are removed in an area below seismic mass 210 in order to make seismic mass 210 deflectable in relation to substrate 110. This is preferably performed using an isotropic etching process, lower oxide layer 120 and spacer layer 140, which is preferably also formed as an oxide layer, being selectively removed down to substrate 110, electrically conductive layer 130, and functional layer 150. The corresponding method stage after etching of sacrificial layers 120, 140 is shown in FIG. 12. It is apparent in this case that layer thickness 223 of both electrodes 221, 222 of first electrode system 220 is designed to be thicker by precisely layer thickness $d_{ox}$ of spacer layer 140 and layer thickness $d_{VP}$ of electrically conductive layer 130 than layer thickness 233 of both electrodes 231, 232 of second electrode system 230.

Figure 13:
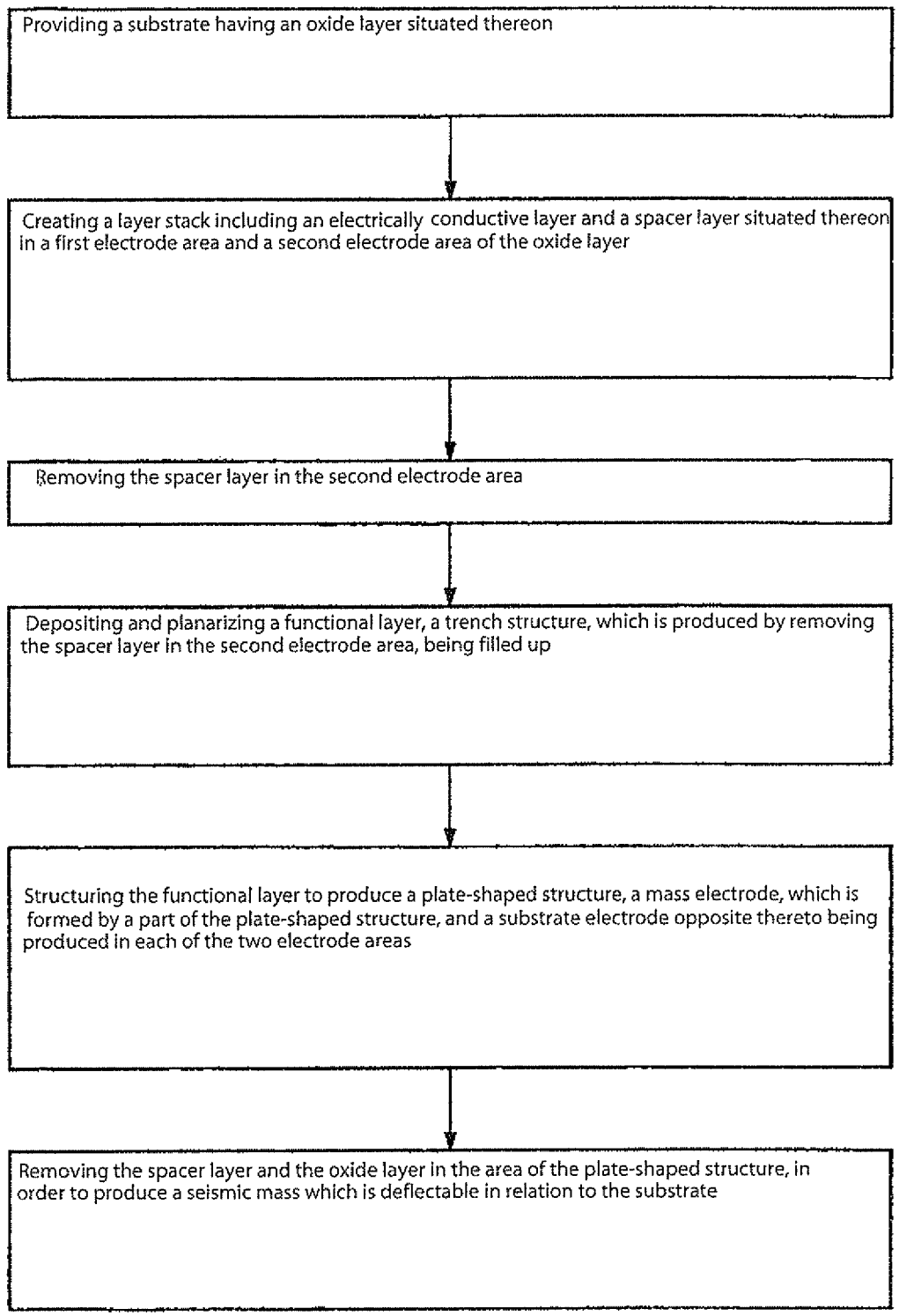
FIG. 13 shows a flow chart of the manufacturing method according to an example embodiment of the present invention.

Finally, FIG. 13 shows a summary of the manufacturing method shown in FIGS. 7 through 12, the method including the following steps:
  providing a substrate (110) having an oxide layer (120) situated thereon,
  creating a layer stack (123, 124), including an electrically conductive layer (130) and a spacer layer (140) situated thereon, in a first electrode area and a second electrode area (121, 122) of the oxide layer (120),
  removing the spacer layer (140) in the first electrode area (121),
  depositing and planarizing a functional layer (150), a trench structure (125), which is produced by removing the spacer layer (140) in the first electrode area (121), being filled up,
  structuring the functional layer (150) and the electrically conductive layer (130) exposed in the first electrode area (121), in order to produce a plate-shaped structure (211), a mass electrode (221, 231), which is formed by a part of the plate-shaped structure (211), and a substrate electrode (222, 232) opposite thereto being produced in each of the two electrode areas (121, 131), and
  removing the spacer layer (140) and the oxide layer (120) in the area of the plate-shaped structure (211), in order to produce a seismic mass (210) which is deflectable in relation to the substrate (110).

Although the preceding description and the claims always refer to a spacer layer used as a sacrificial layer for a sensor in the form of a rocker or trampoline, it is apparent to those skilled in the art that the concept according to the present invention is fundamentally applicable for determining the thickness of any layers. The present invention is also not solely restricted to a sensor in the form of a rocker or trampoline as a test object. Rather, the novel concept may be used for determining the geometric properties of any structure produced using layer deposition.

Although the concept according to the present invention disclosed here was described in the context of a modified lateral acceleration sensor, the present invention is not restricted to such a one-dimensional acceleration sensor. Rather, an acceleration sensor which measures in more than one axis may also be used for determining the layer thickness of the spacer layer. Yaw rate sensors also fundamentally come into consideration for the test structure. However, it is also possible to produce a test structure, which is provided independently for test purposes, separately on the substrate of the micromechanical component, without this test structure being used as an acceleration sensor or a yaw rate sensor.

The specific embodiments described above in connection with the figures are only exemplary embodiments of the present invention. All of the features disclosed in this context may be relevant both individually and also in combination with one another for the implementation of the present invention depending on the application.

What is claimed is:

1. A micromechanical component, comprising:
a substrate having a spacer layer and a test structure for ascertaining a thickness of the spacer layer, the test structure including a seismic mass which is elastically deflectable along a measuring axis parallel to the substrate, and a first electrode system and a second electrode system for deflecting the seismic mass along the measuring axis, each of the first electrode system and the second electrode system having an associated mass electrode which is formed by a part of the seismic mass, and an associated substrate electrode, which is situated on the substrate, in each case;
wherein the first electrode system is thicker than the second electrode system by a layer thickness of the spacer layer.

2. The micromechanical component as recited in claim 1, wherein the two mass electrodes and their associated substrate electrodes are each implemented as two interlocking comb structures.

3. The micromechanical component as recited in claim 1, wherein the test structure is a lateral acceleration sensor having at least one detection electrode system for detecting a lateral deflection of the seismic mass.

4. The micromechanical component as recited claim 1, further comprising:
a sensor structure situated on the substrate, the sensor structure having a mass movable perpendicularly to the substrate, the mass including at least one electrode, which cooperates with a counter electrode situated at a distance determined by the thickness of the spacer layer.

5. The micromechanical component as recited in claim 4, wherein the sensor structure is one of a z-acceleration sensor or a yaw rate sensor in the form of a rocker or trampoline.

6. A method for determining a thickness of a spacer layer on a substrate using a test structure, the test structure including a seismic mass elastically deflectable along a measuring axis parallel to the substrate, a first electrode system and a second electrode system for deflecting the seismic mass along the measuring axis, each of the first electrode system and the second electrode system having a mass electrode formed by a part of the seismic mass, and a substrate electrode, which is situated on the substrate, wherein the first electrode system is to be thicker by a layer thickness of the spacer layer than the second electrode system, the method comprising:
applying a first activation voltage to the first electrode system for deflecting the seismic mass in a first direction and a second activation voltage to the second electrode system for deflecting the seismic mass in a second direction, which is opposite to the first direction,
measuring a resulting equilibrium deflection of the seismic mass; and
calculating the layer thickness of the spacer layer based on at least one of the resulting deflection of the seismic mass, and the first and second activation voltages.

7. The method as recited in claim 6, wherein the first substrate electrode and the second substrate electrode are connected to a shared electrical potential for deflecting the seismic mass.

8. The method as recited in claim 6, wherein a ratio of the activation voltages is selected so that a resulting equilibrium deflection of the seismic mass corresponds to a starting position.

* * * * *